(12) United States Patent
Steinmann et al.

(10) Patent No.: US 11,038,092 B2
(45) Date of Patent: Jun. 15, 2021

(54) FIN-BASED DEVICES BASED ON THE THERMOELECTRIC EFFECT

(71) Applicant: GLOBALFOUNDRIES U.S. Inc., Santa Clara, CA (US)

(72) Inventors: Philipp Steinmann, Albany, NY (US); Puneet H. Suvarna, Albany, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 151 days.

(21) Appl. No.: 16/448,544

(22) Filed: Jun. 21, 2019

(65) Prior Publication Data

US 2019/0319180 A1 Oct. 17, 2019

Related U.S. Application Data

(62) Division of application No. 15/605,289, filed on May 25, 2017, now abandoned.

(51) Int. Cl.
| | |
|---|---|
| *H01L 35/32* | (2006.01) |
| *H01L 35/22* | (2006.01) |
| *H01L 35/34* | (2006.01) |
| *H01L 27/105* | (2006.01) |

(52) U.S. Cl.
CPC ............ *H01L 35/32* (2013.01); *H01L 27/105* (2013.01); *H01L 35/22* (2013.01); *H01L 35/34* (2013.01)

(58) Field of Classification Search
CPC ......... H01L 35/00; H01L 35/02; H01L 35/04; H01L 35/32; H01L 29/06; H01L 29/0657; H01L 29/0669; H01L 29/0673; H01L 29/0684; H01L 29/772; H01L 27/10; H01L 27/105

See application file for complete search history.

(56) References Cited

U.S. PATENT DOCUMENTS

| | | | |
|---|---|---|---|
| 5,430,322 A | 7/1995 | Koyanagi et al. | |
| 6,060,656 A | 5/2000 | Dresselhaus et al. | |
| 6,969,679 B2 | 11/2005 | Okamura et al. | |
| 7,038,234 B2 | 5/2006 | Ghamaty et al. | |
| 9,219,215 B1 | 12/2015 | Yang et al. | |
| 2003/0025174 A1 | 2/2003 | Lubomirsky et al. | |
| 2005/0060884 A1 | 3/2005 | Okamura et al. | |
| 2005/0112872 A1 | 5/2005 | Okamura et al. | |
| 2012/0070947 A1* | 3/2012 | Basker ............ H01L 29/66795 | |
| | | | 438/197 |
| 2012/0139075 A1 | 6/2012 | Shankar et al. | |
| 2016/0079508 A1 | 3/2016 | Kim et al. | |
| 2017/0012194 A1* | 1/2017 | Wang ...................... H01L 35/34 |

(Continued)

OTHER PUBLICATIONS

Google scholar search for "fin thremoelectric stress strain" on Feb. 24, 2021.*

(Continued)

*Primary Examiner* — Christina Chern
(74) *Attorney, Agent, or Firm* — Thompson Hine LLP; Anthony Canale

(57) ABSTRACT

Structures that include semiconductor fins and methods for forming a structure that includes semiconductor fins. A first fin comprised of n-type semiconductor material and a second fin comprised of p-type semiconductor material are formed. A conductive strap is formed that couples an end of the first fin with an end of the second fin.

11 Claims, 3 Drawing Sheets

(56) References Cited

U.S. PATENT DOCUMENTS

2017/0047498 A1    2/2017  Dede

OTHER PUBLICATIONS

Taiwan Intellectual Property Office, Examination Report received in Taiwanese Patent Application No. 107108258 dated Nov. 28, 2019.
Taiwan Intellectual Property Office, Official Action received in Taiwanese Patent Application No. 107108258 dated Jun. 29, 2020.
Li et al., "Thermal conductivity of Si/SiGe superlattice nanowires", Appl. Phys. Lett. 83, 3186 (2003).
Taiwan Intellectual Property Office, Examination Report issued in Application No. 107108258 dated Apr. 1, 2019 and English translation thereof.

* cited by examiner

FIN-BASED DEVICES BASED ON THE THERMOELECTRIC EFFECT

BACKGROUND

The present invention relates to semiconductor device fabrication and integrated circuits and, more specifically, to structures that include semiconductor fins and methods for forming a structure that includes semiconductor fins.

The thermoelectric effect finds application in various devices, such as temperature sensors, thermoelectric generators, and thermoelectric coolers. Thermocouples are a widely used type of temperature sensor that operate based on the thermoelectric effect. Thermocouples may be used to measure temperature and to assess temperature changes. As a result of the thermoelectric effect, a thermocouple produces a temperature-dependent voltage that can be interpreted to measure temperature.

A fin-type field-effect transistor (FinFET) is a non-planar device structure that may be more densely packed in an integrated circuit than planar field-effect transistors. A FinFET may include a fin consisting of a body of semiconductor material, heavily-doped source/drain regions formed in sections of the fin body, and a gate electrode that wraps about the fin body between the source/drain regions.

Advanced semiconductor process nodes suffer from excessive local heat generation that may be caused during operation by high switching frequencies and/or high off-state leakage currents. The local heat generation may benefit from on-chip thermal management, as well on-chip heat sensing and engineered heat transfer.

Improved structures that include semiconductor fins and methods for forming a structure that includes semiconductor fins are needed.

SUMMARY

In an embodiment of the invention, a method includes forming a first fin comprised of n-type semiconductor material, forming a second fin comprised of p-type semiconductor material, and forming a conductive strap coupling an end of the first fin with an end of the second fin.

In an embodiment of the invention, a structure includes a first fin comprised of n-type semiconductor material, a second fin comprised of p-type semiconductor material, the second fin having an end, and a conductive strap coupling an end of the first fin with an end of the second fin.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
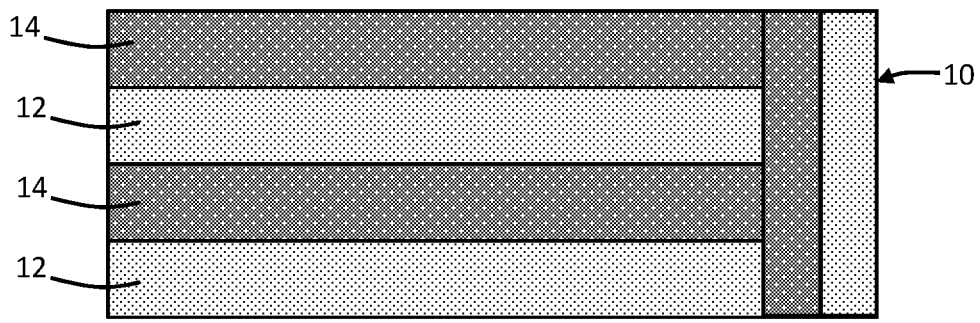
FIG. 1 is a top view of a structure at an initial fabrication stage of a processing method in accordance with embodiments of the invention.

With reference to FIG. 1 and in accordance with embodiments of the invention, a substrate 10 may be a bulk substrate or a device layer of a silicon-on-insulator substrate that is doped to produce alternating doped regions 12 and 14. The regions 12 may be formed by a masked implantation into the epitaxial layer of the substrate 10, and the regions 14 may be formed by a complementary masked implantation into the epitaxial layer of the substrate 10. The regions 12 and the regions 14 are composed of semiconductor material having opposite conductivity types (i.e., n-type and p-type). In an embodiment in which the substrate 10 is composed of silicon, the regions 12 may include a concentration of an n-type dopant from Group V of the Periodic Table (e.g., phosphorus (P) and/or arsenic (As)) that is effective to impart n-type electrical conductivity to the constituent semiconductor material, and the regions 14 may be composed of a silicon-germanium (SiGe) alloy and include a concentration of p-type dopant from Group III of the Periodic Table (e.g., boron (B), aluminum (Al), gallium (Ga), and/or indium (In)) in a concentration that is effective to impart p-type electrical conductivity to the constituent semiconductor material.

Figure 2:
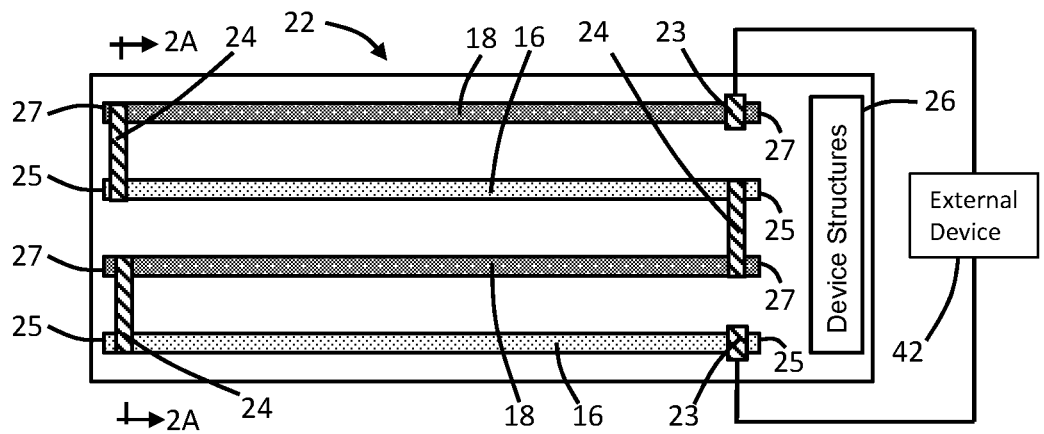
FIG. 2 is a top view of the structure at a fabrication stage subsequent to FIG. 1.
Figure 2A:
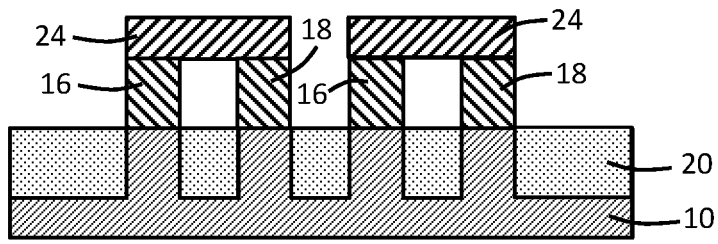
FIG. 2A is a cross-sectional view of the structure of FIG. 2 taken generally along line 2A-2A in FIG. 2.

With reference to FIGS. 2, 2A in which like reference numerals refer to like features in FIG. 1 and at a subsequent fabrication stage, fins 16, 18 are formed using the regions 12, 14 of the substrate 10 and that project in a vertical direction relative to the top surface of the regions 12, 14. The fins 16, 18 are three-dimensional bodies arranged in lengthwise parallel lines that may be formed by photolithography and etching processes, such as self-aligned double patterning (SADP) or self-aligned quadruple patterning (SAQP). The fins 16 extend lengthwise between opposite ends 25 and the fins 18 likewise extend lengthwise between opposite ends 27. Shallow trench isolation regions 20 are formed to isolate the fins 16, 18, and may be composed of a dielectric material, such as an oxide of silicon (e.g., silicon dioxide (SiO$_2$)).

The fins 16 formed by patterning the regions 12 are composed of n-type semiconductor material. The fins 18 formed by patterning the regions 14 are composed of p-type semiconductor material. In the representative embodiment, a single fin 16 is depicted as formed from each region 12 and a single fin 18 is depicted as formed from each region 14. However, multiple fins 16 may be formed from each region 12 and/or multiple fins 18 may be formed from each region 14. In the representative embodiment, fins 16 are formed from each of multiple regions 12 and fins 18 are formed from each of multiple regions 14. However, a minimum number of regions 12 is one and a minimum number of regions 14 is one, and the maximum number of multiple regions 12 and the minimum number of multiple regions 14 is limited by the device design.

An on-chip structure 22 is formed using the fins 16, 18 by connecting the fins 16 with the fins 18 in an alternating manner with conductive straps or connections 24. The fins 16 connected with the fins 18 are located adjacent to each other, and the connections 24 extend between an end 25 of fin 16 and an end 27 of fin 18. The connections 24 may be electrically-conductive features (e.g., metal features) that are formed by middle-of-line (MOL) processing, such as features of a trench silicide layer formed in an interlayer dielectric layer (not shown) of a lowermost metallization level.

The fins 16, 18, when linked by the connections 24, form a plurality of segments that extend back and forth to define a continuous serpentine path for current flow. A current flowing through the structure 22 is constrained to flow in one direction through the full length of one of the fins 16 and then in an opposite direction through the full length of one of the fins 18 with the changes in current direction provided by the connections 24. The changes in direction are provided by the connections 24, which act as bridges furnishing the links between fins 16 and fins 18. The segments defined by fins 16 are comprised of semiconductor material with one conductivity type, and the segments defined by fins 18 are comprised of semiconductor material with the opposite conductivity type. In the representative embodiment, each of the segments of the structure 22 includes one of the fins 16 or one of the fins 18. In an alternative embodiment, each of the segments may include two or more of the fins 16 connected in parallel with the associated connection 24 or two or more of the fins 18 connected in parallel with the associated connection 24.

The end 25 of one of the fins 16 and the end 27 of one of the fins 18 terminate the segments of the structure 22 at its extrema. These terminating ends 25, 27 lack one of the connections 24, but instead include conductive features 23 that are available for establishing an external interconnection to the structure 22. When the connections 24 are formed, the conductive features 23 are formed in the same manner on the terminating end 25 of one of the fins 16 and the terminating end 27 of one of the fins 18 that are free and not connected to other segments by the connections 24. These terminating ends 25 may represent the input and output locations for the connected segments of the structure 22.

Device structures 26 of an integrated circuit may be formed on the substrate 10 as part of a chip. The device structures 26 may be, for example, field-effect transistors and, in particular, may be fin-type field-effect transistors constructed using fins formed in conjunction with the formation of fins 16, 18. During chip operation, the device structures 26 are powered and generate heat energy that operates to heat the substrate 10, which furnishes a temperature gradient that is transferred by thermal conduction to the fins 16, 18.

The fins 16, 18, which are composed of semiconductor materials having different conductivity types, respond to the temperature gradient through the movement of free charge carriers to generate a current by the thermoelectric effect. If the free charge carriers are positive (the semiconductor material of fins 18 is p-type), positive charge carriers will move toward the cooler ends of fins 18. Similarly, negative free charges (the semiconductor material of fins 16 is n-type) will move toward the cooler ends of fins 16.

An external device 42 may be coupled with the conductive feature 23 on the fin 16 at the end 25 terminating the structure 22 and with the conductive feature 23 on the fin 18 at the end 25 that terminates the structure 22. The coupling between the structure 22 and the external device 42 may be facilitated by, for example, additional overlying metallization levels formed by back-end-of-line (BEOL) processing. The external device 42, which may be located off chip, may include temperature measurement electronics that can receive and amplify a current generated by the structure 22 by the thermoelectric effect and produce a temperature measurement representative of the thermal environment of the structure 22 on the substrate 10. In this mode of operation, the structure 22 may operate as a thermocouple that provides temperature sensing by the thermoelectric effect. Alternatively, the external device 42 may be a load that receives a current from the structure 22 in order to harvest thermoelectric energy generated when the structure 22 is heated by the operation of the device structures 26. Alternatively, the external device 42 may be a power supply that supplies a current to the structure 22 and thereby causes the structure 22 to operate by the thermoelectric effect as a Peltier cooler. In this mode of operation, the structure 22 can be used in connection with thermal management on the chip to cool the device structures 26.

Figure 2B:
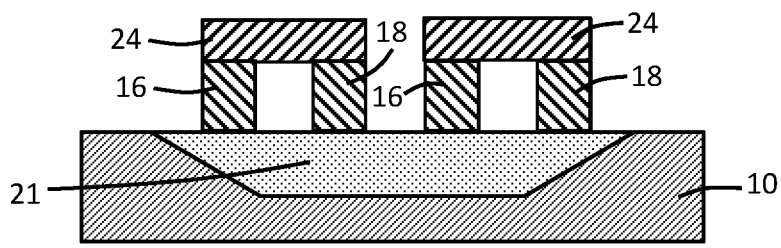
FIG. 2B is a cross-sectional view similar to FIG. 2A in accordance with alternative embodiments of the invention.

With reference to FIG. 2B in which like reference numerals refer to like features in FIG. 2A and in accordance with alternative embodiments, the fins 16, 18 may be located on a dielectric layer 21 that is formed by laterally etching the substrate 10 to undercut the fins 16, 18 with a cavity and then filling the resultant cavity with a dielectric material, such as silicon dioxide ($SiO_2$), having a thermal conductivity that is less than the thermal conductivity of the semiconductor material of the substrate 10. The dielectric layer 21 provides full thermal isolation of the fins 16, 18 from the substrate 10, and may operate to improve the figure of merit relating to the ability to efficiently produce thermoelectric power.

Figure 3:
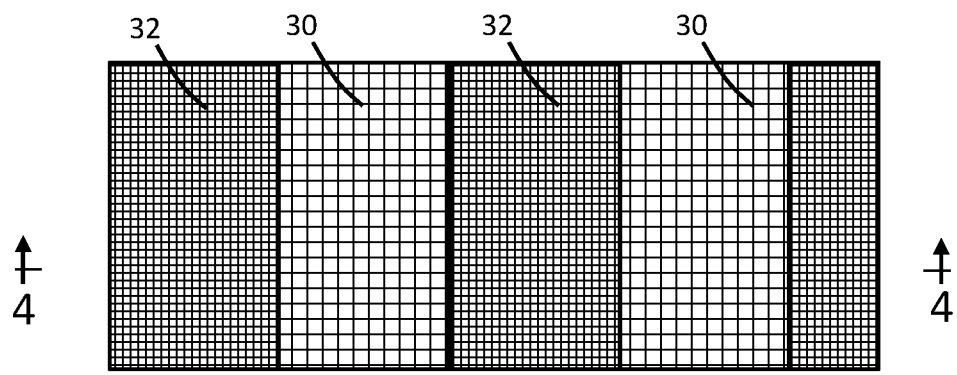
FIG. 3 is a top view of a structure at an initial fabrication stage of a processing method in accordance with alternative embodiments of the invention.
Figure 4:
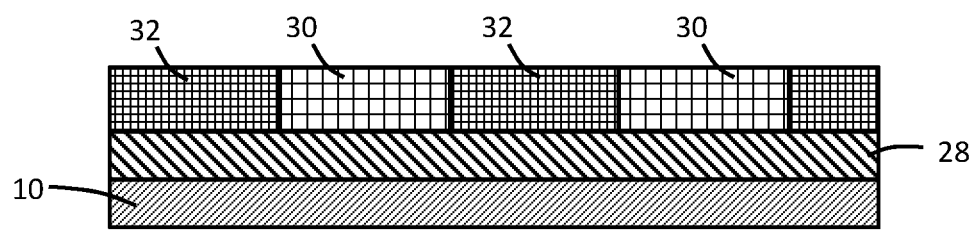
FIG. 4 is a cross-sectional view of the structure of FIG. 3 taken generally along line 4-4 in FIG. 3.

With reference to FIGS. 3 and 4 in which like reference numerals refer to like features in FIG. 1 and in accordance with alternative embodiments, the thermal conductivity of the fins 16 and the fins 18 may be reduced through the introduction of alternating compressive strain and tensile strain. In an embodiment, the substrate 10 may be modified to provide the alternating compressive and tensile strains to the fins 16, 18. Specifically, the substrate 10 may be a strain-relaxed buffer (SRB) substrate that includes an SRB layer 28 at its top surface. The SRB layer 28 is formed to account for lattice mismatch between the substrate 10 and an epitaxial semiconductor material of different lattice structure grown on the substrate 10. An example is the epitaxial growth of silicon-germanium (SiGe) on a substrate that is composed of silicon. The germanium content of the semiconductor material of the SRB layer 28 is gradually increased (e.g., linearly or stepwise graded) with increasing distance from the silicon substrate 10. As a result, the crystal structure of the semiconductor material of the SRB layer 28 gradually transitions from that of silicon near the substrate 10 to that of a silicon-germanium alloy of a given composition at the top of the SRB layer 28. For example, the composition at the top surface of the SRB layer 28 may be twenty (20) atomic percent germanium and eighty (80) atomic percent silicon.

Epitaxial layers 30 and 32 are formed on the top surface of the SRB layer 28. The epitaxial layers 30 may be formed by epitaxially growing a uniform layer of its semiconductor material (e.g., silicon) on the top surface of the SRB layer 28, and then patterning the layer of semiconductor material. The epitaxial layers 32 are epitaxially grown from the areas on the top surface of the SRB layer 28 in the areas opened by the patterning and not covered by the epitaxial layers 30. A chemical mechanical polishing (CMP) process may be employed to remove topography and provide a planarized surface.

The epitaxial layers 30 may be composed of a material (e.g., silicon) that is lattice mismatched with the semiconductor material of the SRB layer 28 to incorporate tensile stress. For example, silicon has a smaller lattice constant than the silicon-germanium of the SRB layer 28 at its top surface and will include tensile strain arising from tensile stress. The epitaxial layers 32 may be composed of a material (e.g., silicon-germanium) that is lattice mismatched with the semiconductor material of the epitaxial layers 30 and with the semiconductor material of the SRB layer 28. For example, the composition of the epitaxial layers 32 may be forty (40) atomic percent germanium and sixty (60) atomic percent silicon on an SRB layer 28 having a composition of twenty (20) atomic percent germanium and eighty (80) atomic percent silicon at the top surface. Due to the higher germanium content, the silicon-germanium of the epitaxial layers 32 will have a larger lattice constant than the silicon-germanium of the SRB layer 28 at its top surface and will include compressive strain arising from compressive stress.

Figure 5:
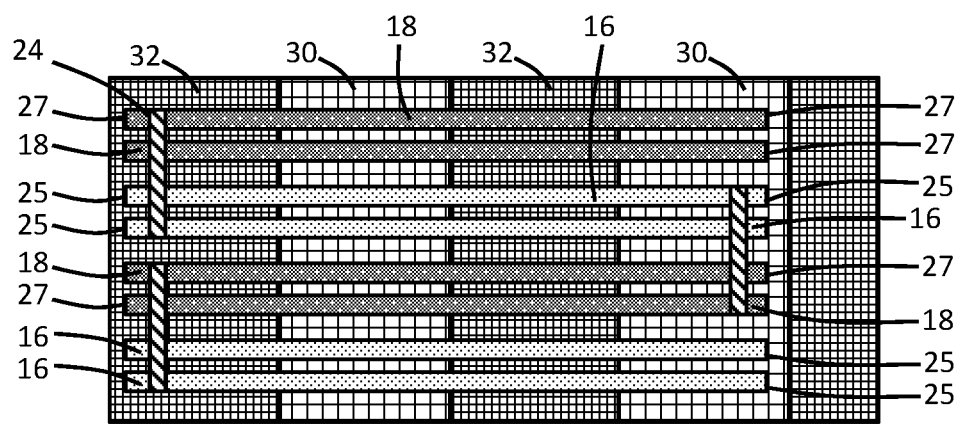
FIG. 5 is a top view of the structure at a fabrication stage subsequent to FIG. 3.

With reference to FIG. 5 in which like reference numerals refer to like features in FIGS. 3, 4 and at a subsequent fabrication stage, the process continues with the deposition of an epitaxial layer on the epitaxial layers 30, 32, followed by the formation of the regions 12, 14, and the formation of the fins 16, 18 from the regions 12, 14 as described in the context of FIG. 1. The fins 16, 18 may be doped, after being formed, to have the appropriate conductivity types by introducing dopants through a set of masked ion implantations. In connection with this embodiment, multiple fins 16 composed of n-type semiconductor material and multiple fins 18 composed of p-type semiconductor material may be formed and connected as a group by the connections 24. The process flow continues as described in connection with FIG. 2 to complete the structure 22 on the epitaxial layers 30, 32 with multiple fins 16 and multiple fins 18 in each segment of the structure 22.

Along their respective lengths, the fins 16 and the fins 18 will cross over the strained epitaxial layers 30 and 32 in an alternating manner. Stress is transferred from the strained epitaxial layers 30 and 32 to the overlying sections of the fins 16, which induces tensile and compressive strains that alternate along the length of the fins 16. Similarly, stress is transferred from the strained epitaxial layers 30 and 32 to the overlying sections of the fins 18, which induces tensile and compressive strains that alternate along the length of the fins 18.

Figure 6:
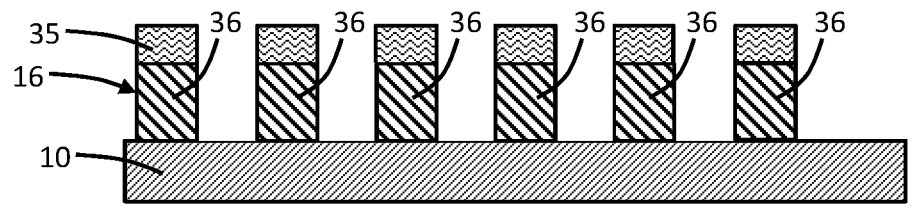
FIG. 6 is a cross-sectional view of an n-type semiconductor fin of the structure at a fabrication stage subsequent to FIG. 1 of a processing method in accordance with alternative embodiments of the invention.
Figure 7:
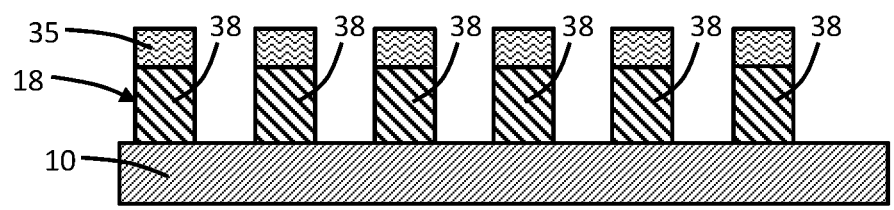
FIG. 7 is a cross-sectional view of a p-type semiconductor fin of the structure at a fabrication stage subsequent to FIG. 1 of a processing method in accordance with alternative embodiments of the invention.

With reference to FIGS. 6, 7 in which like reference numerals refer to like features in FIG. 2 and in accordance with alternative embodiments, the thermal conductivity of the fins 16 and the fins 18 may be reduced by introducing the lengthwise alternating compressive and tensile strains in a different manner. Specifically, the construction of the fins 16 and the fins 18 may be modified to provide the alternating compressive and tensile strains.

To that end, the fins 16, 18 are formed from the doped semiconductor materials of the regions 12, 14 as described in the context of FIGS. 1 and 2. The fins 16, 18 are then patterned along their lengths to remove spaced-apart sections. To that end, an etch mask 35 is applied that covers sections of the fins 16, 18. The etch mask 35 may comprise a set of dummy gates and sidewall spacers formed as part of a replacement metal gate process being used to form field-effect transistors (e.g., device structures 26) on a different portion of the substrate 10. Unmasked sections of the fins 16, 18 are removed with an etching process. The unmasked sections of the fins 16, 18 may be completely removed, as shown in the representative embodiment. In alternative embodiments, the unmasked sections of the fins 16, 18 may be recessed and only partially removed (e.g., removal of 80 percent of the thickness). The masked sections 36 of the fins 16 and the masked sections 38 of the fins 18 are preserved, and are spaced apart lengthwise by open gaps.

Figure 8:
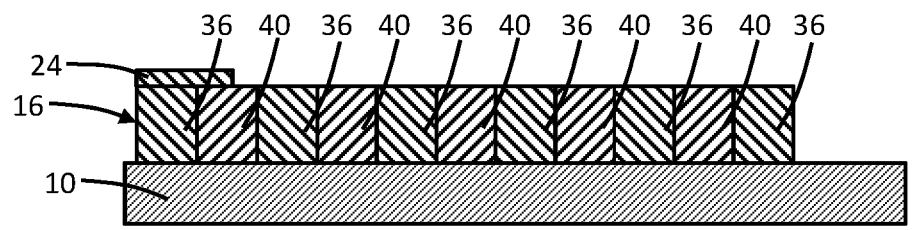
FIG. 8 is a cross-sectional view of the n-type semiconductor fin at a fabrication stage subsequent to FIG. 6.
Figure 9:
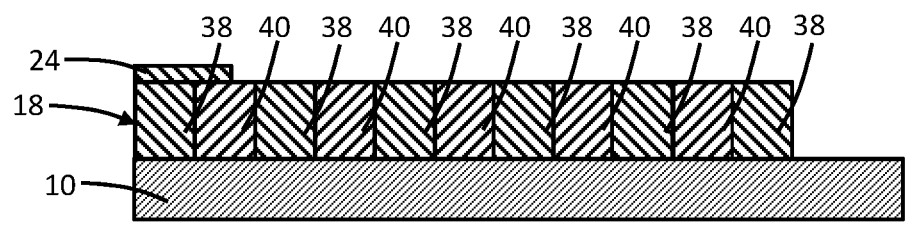
FIG. 9 is a cross-sectional view of the p-type semiconductor fin at a fabrication stage subsequent to FIG. 7.

With reference to FIGS. 8, 9 in which like reference numerals refer to like features in FIG. 6, 7 and at a subsequent fabrication stage, the open gaps between the masked sections 36 of the fins 16 and the open gaps between the masked sections 38 of the fins 18 are filled with sections 40 of an epitaxial-grown semiconductor layer, and the etch mask 35 is removed. The removal of the etch mask 35 may coincide with the removal of dummy gates in the replacement gate process forming field-effect transistors on the different portion of the substrate 10. An anneal may be performed to diffuse dopant from the sections 36 of fins 16 to the sections 40 and from the sections 38 of fins 18 to the sections 40 and/or ion implantations may be used to dope the sections 40 to match the conductivity type of the fins 16 or the conductivity type of the fins 18.

In an embodiment, the sections 40 of the semiconductor layer may be composed of a silicon-germanium alloy and the fins 16, 18 may be composed of silicon. In an alternative embodiment, the sections 40 of the semiconductor layer may be composed of silicon and the fins 16, 18 may be composed of a silicon-germanium alloy, which would require that the epitaxial layer that is patterned to form the fins 16, 18 be composed of the silicon-germanium alloy.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first fin comprised of n-type semiconductor material, the first fin having an end;
    a second fin comprised of p-type semiconductor material, the second fin having an end; and
    a conductive strap coupling the end of the first fin with the end of the second fin,
    wherein the first fin includes a first plurality of sections and a second plurality of sections that alternate with the first plurality of sections, the second fin includes a first plurality of sections and a second plurality of sections that alternate with the first plurality of sections, the first plurality of sections of the first fin and the first plurality of sections of the second fin are under tensile strain, and the second plurality of sections of the first fin and the second plurality of sections of the second fin are under compressive strain.

2. The structure of claim 1 further comprising:
    a strain-related buffer;
    a plurality of first epitaxial layers on the strain-related buffer; and
    a plurality of second epitaxial layers on the strain-related buffer,
    wherein the plurality of first epitaxial layers are arranged in an alternating manner with the plurality of second epitaxial layers, the plurality of first epitaxial layers have a first lattice constant, the plurality of second epitaxial layers have a second lattice constant that is greater than the first lattice constant, and the first fin and the second fin are arranged to extend lengthwise across the plurality of first epitaxial layers and the plurality of second epitaxial layers.

3. The structure of claim 2 wherein the first plurality of sections of the first fin and the first plurality of sections of the second fin are on the plurality of first epitaxial layers, and the second plurality of sections of the first fin and the second plurality of sections of the second fin are on the plurality of second epitaxial layers.

4. The structure of claim 2 wherein the plurality of first epitaxial layers comprise silicon, and the plurality of second epitaxial layers comprise a silicon-germanium alloy.

5. The structure of claim 1 wherein the first plurality of sections of the first fin and the second plurality of sections of the second fin have a first lattice constant, the second plurality of sections of the first fin and the second plurality of sections of the second fin have a second lattice constant, and the second lattice constant is greater than the first lattice constant.

6. The structure of claim 5 wherein the first plurality of sections of the first fin and the first plurality of sections of the second fin comprise silicon, and the second plurality of sections of the first fin and the second plurality of sections of the second fin comprise silicon-germanium.

7. The structure of claim 1 wherein the first fin is arranged parallel to the second fin, and the conductive strap is arranged transverse to the first fin and the second fin.

8. The structure of claim 1 wherein the conductive strap is a trench silicide layer of a first metallization level.

9. The structure of claim 1 further comprising:
    an external device coupled with the first fin and the second fin.

10. The structure of claim 9 wherein the external device is configured to receive a current generated by the first fin and the second fin.

11. The structure of claim 9 wherein the external device is configured to supply a current to the first fin and the second fin.

* * * * *

UNITED STATES PATENT AND TRADEMARK OFFICE
CERTIFICATE OF CORRECTION

PATENT NO. : 11,038,092 B2
APPLICATION NO. : 16/448544
DATED : June 15, 2021
INVENTOR(S) : Philipp Steinmann et al.

Page 1 of 1

It is certified that error appears in the above-identified patent and that said Letters Patent is hereby corrected as shown below:

In the Claims

At Column 8, Claim No. 5, Line 17, change "and the second plurality of sections" to --and the first plurality of sections--

Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*